United States Patent [19]

Brodsky et al.

[11] Patent Number: 5,468,159

[45] Date of Patent: Nov. 21, 1995

[54] PORTABLE EXTERNAL FLEXIBLE CABLE AND PACKAGE USING SAME

[75] Inventors: William L. Brodsky, Binghamton; James D. Herard, Vestal, both of N.Y.

[73] Assignee: International Business Machines Corporation, Armonk, N.Y.

[21] Appl. No.: 288,179

[22] Filed: Aug. 10, 1994

Related U.S. Application Data

[63] Continuation-in-part of Ser. No. 44,330, Apr. 7, 1993, abandoned.

[51] Int. Cl.⁶ .................................................. H01R 13/72
[52] U.S. Cl. ........................ 439/501; 439/498; 174/117 F
[58] Field of Search ............................. 439/34, 501, 502, 439/503, 492, 498, 499; 174/117 F, 117 FF; 191/12.2 A, 12.4; 29/842, 848, 841

[56] References Cited

U.S. PATENT DOCUMENTS

| | | | |
|---|---|---|---|
| 1,253,415 | 1/1918 | Nesbitt . | |
| 3,147,833 | 9/1964 | McWilliams et al. | 191/12.4 |
| 3,801,752 | 4/1974 | Gdovichin | 191/12.2 R |
| 4,075,420 | 2/1978 | Walton | 174/117 |
| 4,201,278 | 5/1980 | Balde . | |
| 4,281,211 | 7/1981 | Tatum et al. | 174/117 F X |
| 4,313,029 | 1/1982 | Bunish | 174/117 F X |
| 4,417,703 | 11/1983 | Weinhold | 242/107.12 |
| 4,812,135 | 3/1989 | Smith | 439/493 |
| 4,851,613 | 7/1989 | Jacques | 174/68.5 |
| 5,073,683 | 12/1991 | Anderson et al. | 174/117 |

FOREIGN PATENT DOCUMENTS 1366343  12/1964  France .

*Primary Examiner*—Khiem Nguyen
*Attorney, Agent, or Firm*—Lawrence R. Fraley

[57] ABSTRACT

This invention provides a means of using flexible (also often referred to as simply "flex") circuit structures for external cabling in a small light package, particularly those utilized in portable computers. The external cabling is composed of a flex circuit that is strengthened by fiber strands, and a wrapped sheath of woven mesh netting. The cabling may be further encased in an overcoating for protection against abrasion and chemicals. The packaging scheme using this cable may include a storage device for the cable such that the cable is retractable.

11 Claims, 2 Drawing Sheets

PORTABLE EXTERNAL FLEXIBLE CABLE AND PACKAGE USING SAME

This is a continuation-in-part of application Ser. No. 08/044,330 filed on Apr. 7, 1993 now abandoned.

TECHNICAL FIELD

This invention relates to external cabling and particularly that which may be used with portable computers.

BACKGROUND OF THE INVENTION

Flexible external cables for use with portable computers are known in the prior art. Examples are shown in U.S. Pat. Nos. 4,417,703, 4,075,420, and 4,812,135. Such cables, intended for use external to the housing of a particular type of electronic device (e.g., a computer) often present unique problems not solved by the prior art. Further, flexible flat cables used in the field of portable electronics, and specifically in the field of portable computers, may present additional problems.

Flexible flat cables are typically fragile. Such cables lack strength due to the relatively small size and flat geometry thereof. Generally, external stress relief devices are required to strengthen the cable but such stress relief members often reduce the flexible properties of the cables.

Flat ribbon-like flexible cables that are unprotected may suffer breakage in bending. Further, stress on flexible cable from pulling the cable may result in tearing and disconnecting of any attached connectors.

When flexible flat cables are employed outside of the protective housing of electronic devices, damage may occur. The exposure of the cables to outside forces may result in accidental piercing and/or cutting of the cable's internal conductive elements. In addition, exposure to industrial environment chemicals may result in corrosive damage.

The desired light weight and small size of flexible flat cables make these ideal for transporting for use with portable computing devices such as laptop and notebook class computers. The trend toward even smaller sub-notebook class computers with less functional hardware increases the need for connection to external devices. Unfortunately the fragile nature of flexible cables inhibit the ability to use them in a traveling environment.

Some attempts to strengthen flexible cables in the prior art, for example U.S. Pat. No. 4,417,703, have included the use of laminated fibers to the ribbon cable. Unfortunately, direct bonding to the ribbon cable changes the electrical characteristics of the cable and, therefore, produces undesirable side-effects.

The length of the cable may also present a problem for travelers. A lengthy cable is often difficult to pack and store. Further, if any substantial length of cable is needed for a networking or communication application, the cable may become entangled and present a potential safety problem.

It is often difficult to predetermine the appropriate length for a cable, so the end user either has to carry a cable that is too long and deal with the disadvantages associated with unneeded cable length. For example, the extra length may be sprawled across the working area. The end user may carry a shorter cable as a remedy for such disadvantages, but there is an inherent risk that the cable will be too short for the job.

Flexible flat cables also tend to be slippery and therefore more difficult to grasp than other cables. This may result in user difficulty in connecting one component to another.

Further, the flat geometry yields sharp edges that, in addition to being difficult to handle, present a slight risk of injury.

Flexible flat cables used in portable computing environments may also be susceptible to adverse materials (e.g. chemicals, abrasives, etc.).

Accordingly, a flexible flat cable for use with portable computers and similar devices that overcomes the above described disadvantages is deemed to constitute a significant advancement in the art.

DISCLOSURE OF THE INVENTION

Objectives

A primary object of the present invention is to enhance the art of flexible flat cables by providing a cable capable of overcoming the aforementioned disadvantages of prior art cables.

It is a more particular object of this invention to provide a system for storing flexible flat cables which is small and lightweight and therefore easily portable.

It is a further object of this invention to provide a flexible flat cable system which is strong enough to withstand the often rigorous portable computing environment.

It is a yet further objective of this invention to provide a flexible flat cable system that eliminates sharp edges.

It is yet another object of this invention to provide a flexible flat cable system that has increased abrasion resistance and a higher coefficient of friction of the outer surfaces thereof.

It is a yet further object of this invention to provide a flexible flat cable system that meets all of the above objectives without changing the electrical characteristics of electrical circuit lines included therein.

SUMMARY OF THE INVENTION

In accordance with these objects, a cabling system is provided for using flexible flat external cabling in a small light package appropriate for the portable computer market. The cable is strengthened by the use of fiber strands, and a wrapped sheath of woven mesh netting. The cable, fiber strands and mesh netting are further encased in an overcoating for protection against abrasion and chemicals. The strengthened cable can be used in a cabling system that employs a storage device so that the cable is either extendable or retractable. Some examples of a preferred embodiment employ aramide fiber strands for strengthening the cable, and a flexible circuit composed of a base material of polyamide film or polyethylene film.

BRIEF DESCRIPTION OF THE DRAWINGS

For an understanding of the invention, reference will be made by way of example to the accompanying drawings in which.

PREFERRED EMBODIMENT OF THE INVENTION

Figure 1:
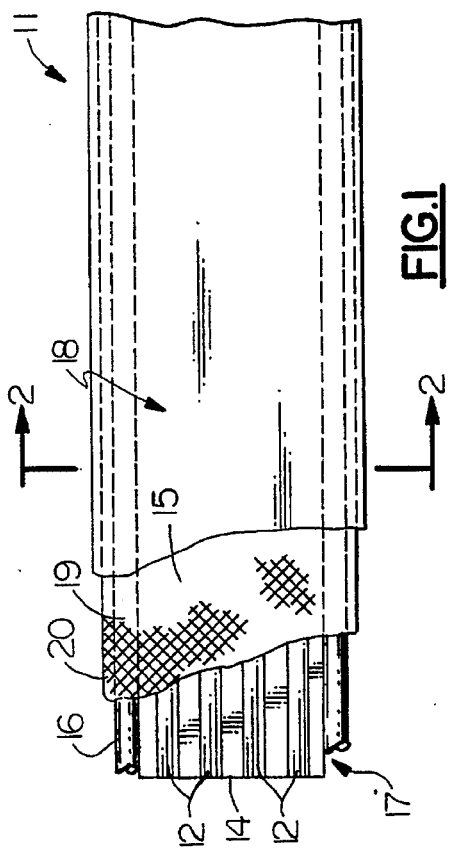
FIG. 1 is a partial top view of a flexible cable assembly in accordance with one embodiment of the invention.

FIG. 1 is a planar view of a flexible cable 11 in accordance with one embodiment of the invention. A flat, dielectric (e.g. polyimide) substrate ribbon 14, having a plurality of electrically conductive (e.g. copper) lines 12 is fully wrapped in a sheath 10 of cross-webbed netting. This ribbon and circuitry may also be referred to as a flexible circuit 17. The sheath 10 provides a woven mesh shown generally at 15 on the outside of the flexible cable 14. Woven mesh 15 is located far from the neutral axis of the flexible circuit 17 to thereby increase the bending strength of this member. Thus, undesirable kinks and folds are substantially eliminated. In addition, the cross pattern of the woven mesh 15 provides tear resistance and added pull strength. Mesh 15 is formed by weave 19 intersecting warp 20 at an approximately 90 degree angle. Weave 19 is disposed at an approximately 45 degree angle to each longitudinal axis of strands 16.

Figure 2:
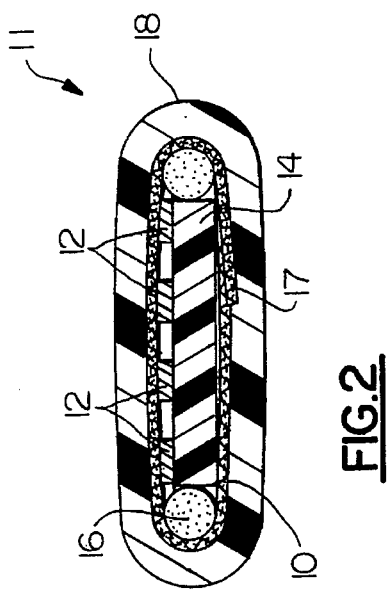
FIG. 2 is a cross-sectional view of the flexible cable of an enlarged scale and as taken along the line 2—2 in FIG. 1.

Flexible ribbon 14 is preferably composed primarily of a polyamide film commonly known as KAPTON, or a polyethylene film commonly known as MYLAR. KAPTON and MYLAR are trademarks of the E. I. dupont deNemours Corporation (duPont). As seen in FIG. 2, each conductive line is of substantially rectangular cross-section. All of these lines 12 are attached to an upper surface of the dielectric ribbon 14. It is also possible to provide such conductive lines internally of ribbon 14, in a planar orientation similar to that shown for the top conductive lines in FIG. 2. In this arrangement, all of the conductive lines would thus be surrounded (encased) by the ribbon's dielectric. The preferred aspect ratio of the width of ribbon 14 to its thickness (the narrower, vertical dimension in FIG. 2) is preferably 10:1 or greater. An aspect ratio as high as 300:1 may be used. (The view in FIG. 2 is not necessarily to scale, for illustration purposes. ) Conductive lines 12 are preferably made of copper or some other suitable conductive material known in the art.

High strength fibers, preferably composed of aramide commonly known as KEVLAR, are employed to form a pair of fiber strands 16. KEVLAR is also a trademark of dupont. At least one fiber strand 16 is located along each side edge of ribbon 14 for increased longitudinal strength in the overall end structure of cable 11. Each fiber strand 16 prevents tearing ribbon 14, and also protects conductors 12 from metal fatigue as may occur from excessive bending. Additionally the roundness of each fiber strand 16 creates a radius to substantially assure rounded, non-sharp edges for the final cable 11.

Preferably, each fiber is not securely attached (e.g., using adhesive) to the respective ribbon (dielectric) 14 but instead designed to move independently with respect to the ribbon during twisting, pulling or other similar motion of cable 11. Such independent movement allows the fiber 16 to substantially endure the forces and/or stresses imposed on the cable as a result of said movement such that said forces/stresses do not adversely affect the internal, adjacent ribbon. The preferred fibers for accomplishing this are high stiffness, low strain fibers. The overall diameter of each multistrand fiber is approximately the same as the corresponding thickness of the adjacent ribbon.

An overcoating 18 encases the sheath 10, flexible ribbon 14 and attached circuit lines 12, as well as the parallel strands 16. Overcoating 18 is preferably comprised of polyvinylchloride (PVC) material. Other materials which can be used include the families of ureathanes, silicones, and the like. The materials to be coated are dipped and baked at 350 degrees F. Low temperature curing resins are optimum for the dip and bake process. The advantage of the dipping process is that it allows selective application of overcoating 18 to a flexible cable that may have exposed gold contact pads on either ends. This allows for easy coating of odd shapes and lengths of cable. In addition, the dipping process is preferred over extrusion or lamination practices because the process requires little or no special tooling.

Overcoating 18 provides chemical and abrasion resistance for cable 11, while also providing structural reinforcement. Overcoating 18, made from the preferred family of materials, has a high coefficient of friction in order to make grasping of the cable easier. The overcoating 18, as described above, is easily applied over the flexible cable ribbon 14 and will adhere well to the sheath 10. Overcoating 18 will preferably encapsulate both the mesh 15 and adjacent fiber strands 16, while allowing ribbon 14 (and attached circuit lines 12), which are not fixedly secured to the mesh (or overcoat) to still move independently within the mesh-overcoating fiber structure as found. The life of the overcoating 18 will be further increased by the radius effect of each fiber strand 16 which will tend to eliminate cracking of the overcoat that may occur should the relatively sharp-edged flexible ribbon 14 cut through overcoating 18.

The woven mesh 15 applied over the flexible cable ribbon 14, is not necessarily continuous as would be the case with a woven tube (e.g. a sock, or the metal shielding on a coax cable). A preferred material for mesh 15 is nylon, due to its ability to stretch during application of forces to cable 11. Alternative materials include KEVLAR, or stainless steel or other similar metals. The woven mesh 15 could be formed in a sheet and then heat staked to itself where it overlaps. Such a process may make manufacturing more simple, and hold fiber strands 16 in place during the dipping process for overcoating 18.

The fiber strands 16 and the woven mesh 15 are not in electrical contact with the flexible cable ribbon 14 and the attached circuit lines 12. Thus, structural support is provided without affecting the electrical characteristics of the circuit lines. This is a particular advantage over prior art systems that laminate structural support against circuit lines and thereby affect line capacitance.

Figure 3:
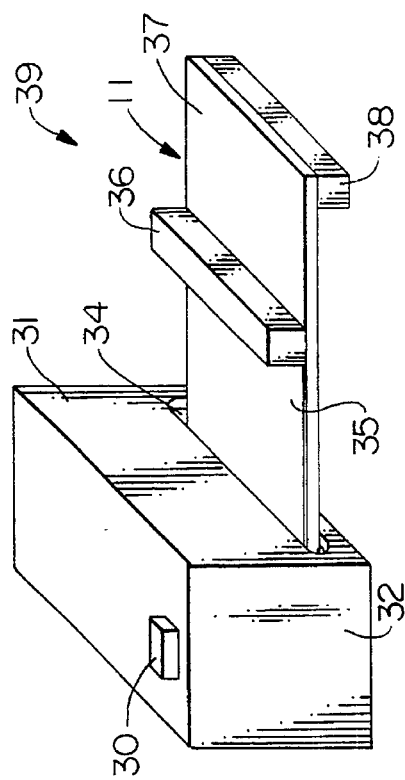
FIG. 3 is a perspective view of a storage case for a flexible cable of the invention.

FIG. 3 is a perspective view of one preferred embodiment of a portable external flexible cable system, shown generally at 39. Storage case 32 is used to house a flexible cable 1 1 of the type illustrated in FIG. 1. The storage case 32 provides protection and means for storing excess length in a portable lightweight package. Storage case 32 includes an opening 34 which serves as an entry and exit port for flexible cable 11 (shown extended).

Flexible cable 11 terminates with connectors 36 or 38 attached to ends 35 and 37 respectively. The type of connector depends on the application. For example, one connector may serve to connect to a portable computer while another may serve to connect to an external device (e.g. an external tape drive for back up of data). While only two connectors are shown, it is easy to see that by splitting the cable, additional connectors may be attached. Therefore the invention is not limited to this preferred embodiment of two connectors.

Figure 4:
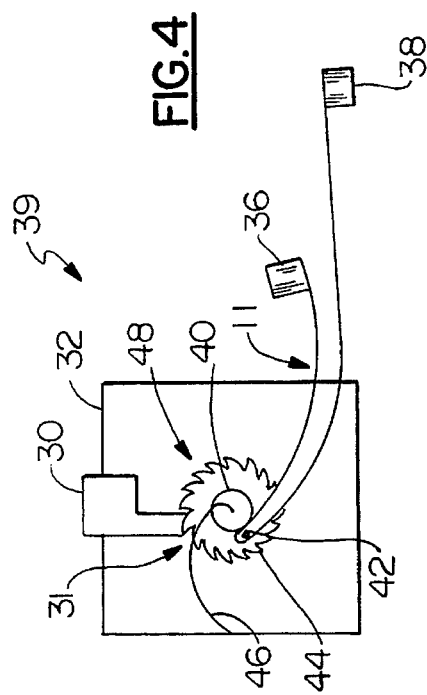
FIG. 4 is a cross-sectional view of a storage case for a flexible cable, including a retention and retraction device contained in the case and illustrating the cable in an extended position.

FIG. 4 is a cross sectional view of the portable cable system 39 exposing the internal relationship of the flexible cable 11 to a retention and retraction device shown generally at 48.

Spool 40 utilizes a ratchet wheel 44 and coil spring 46 to retain and retract the flexible cable 11. A retainer rod 42 works in rotational communication with spool 40 to wrap or release flexible cable 11 depending upon the rotational direction of spool 40. Ratchet wheel 44 is concentric with spool 40 such that prevention of rotation of ratchet wheel 44 will prevent movement of spool 40.

Coil spring 46 places a spring biasing load upon spool 40. Conveniently, push button 30 is provided integral with lever 31 to hold or release the ratchet wheel 44, depending on the position of button 30. When button 30 is depressed, lever 31 releases ratchet wheel 44 and the spring force of coil spring 44 forces the spool to retract the cable 11.

Figure 5:
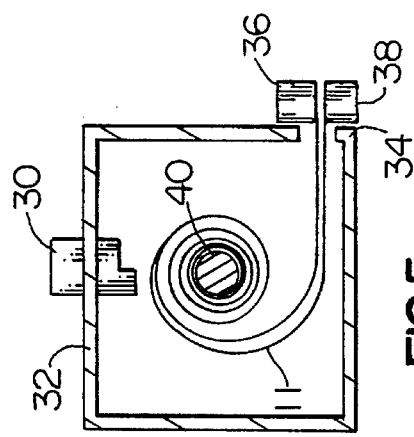
FIG. 5 is a cross-sectional view of the storage case of FIG. 4, illustrating the cable retracted.

FIG. 5 is the same cross-sectional view of FIG. 4; however, the flexible cable 11 is shown in a retracted position after the button 30 has been depressed. Significantly, connectors 36 and 38 prevent cable 11 from passing completely through opening 34.

To manufacture the cable assembly 11, the flexible cable 14 with connectors 36 and 38 attached and each strengthening fiber strand 16 is wrapped in sheath 10 and then covered with overcoating 18. When the overcoating 18 is dry the cable is folded in half as shown in FIG. 4 and placed under retainer rod 42 on spool 40. The wound cable mechanism is then loaded into the storage case 32 and the cover 31 is permanently attached.

Operation of system 39 is relatively simple. The user initially receives the system 39 with both ends of the cable 11 exposed. The user can then pull on the cable until the desired lengths are exposed. The retraction latches and lever 31 prevents movement of ratchet wheel 44. To retract cable 11, the user simply presses the release button 30 and spring loaded spool 40 rewinds the cable 11.

Figure 7:
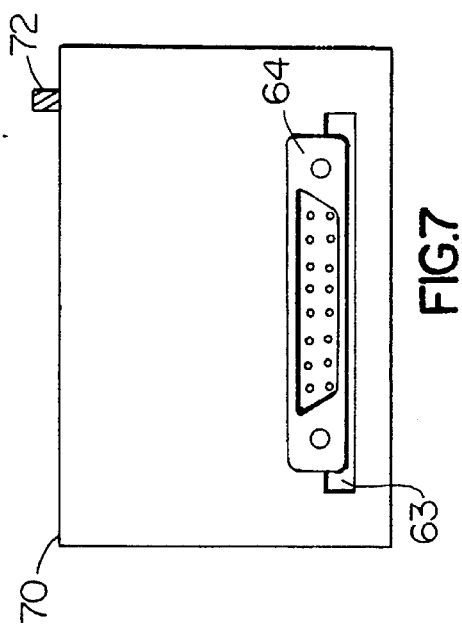
FIG. 7 is a front view of the storage case in FIG. 6.
Figure 8:
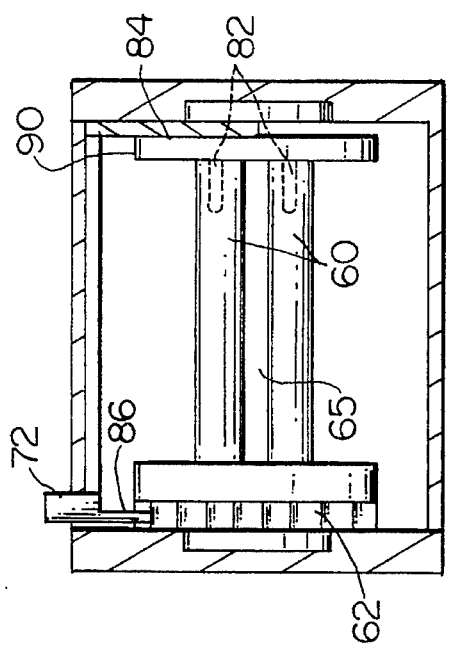
FIG. 8 is a front cross-sectional view of the storage case of FIG. 6.
Figure 6:
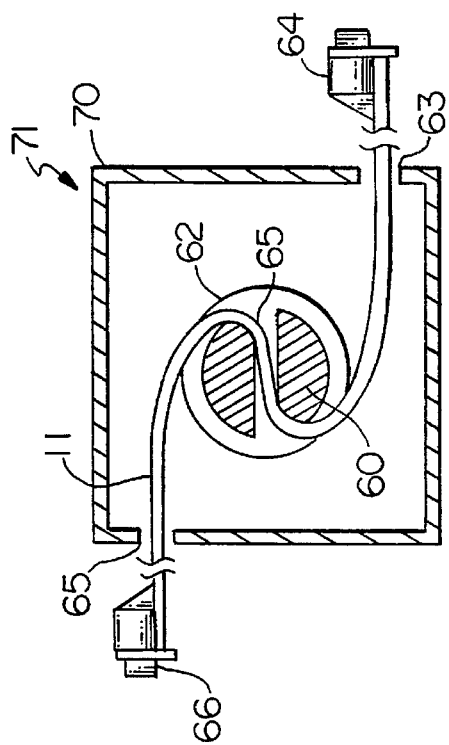
FIG. 6 is a side cross-sectional view of an alternative embodiment of a storage case.

An alternative preferred embodiment of the invention is illustrated in FIGS. 6–8. FIG. 6 is a cross sectional cut-away view of storage case 70 which illustrates an alternative embodiment of a portable external flexible cable system shown generally at 71.

Connectors 64 and 66 are attached at either end of flexible cable 11. Flexible cable 11 is preferably the same flexible cable used in the previously defined embodiment of a portable external flexible cable system, but the connectors 64 and 66 are illustrated as a different type. However, it is clear that the system would work with any type of electrical connector. For example, FIG. 7 illustrates the use of a communications connector such as a serial type interface but it could just as easily be a connector to allow communications via a parallel line.

Storage case 70 is very similar to storage case 32 but openings 63 and 65 are provided to allow the cable to enter and exit on opposite sides of case 70. The exact location of the openings is not considered critical.

FIG. 8 shows that spool 60 is concentric with ratchet wheel 62 and a similar relationship exists between release button 72 with integral lever 86 as in the similar elements of the previously described preferred embodiment. Coil spring 84 serves to provide a torsional load for retraction of the cable 11, when button 72 is depressed.

Spool 60 forms a slot 65 for easy threading of the flexible cable 11. Spool retaining pegs 82 on spool end flange 90 are adhesively attached to apertures formed in spool 60.

Manufacturing of the alternative preferred embodiment is almost identical to the steps described for manufacturing of the first described embodiment, and use of the system 71 is also similar to that of system 39.

It has been shown that this invention provides a smaller, lighter weight cable system for the user and does so in a convenient package that is self-protecting and easy to transport. The system takes up little space and is therefore easier for travelers to pack. The unique packaging mechanism makes the system ideal for portable computer applications.

In addition, it has been shown that the assembly of the cable provides for a safer, more reliable, fatigue resistant design, without changing the electrical characteristics of enclosed circuit lines.

While there have been shown and described what are at present considered the preferred embodiments of the invention, it will be obvious to those skilled in the art that various changes and modifications may be made therein without departing from the scope of the invention as defined by the appended claims.

What is claimed is:

1. A flexible cable comprising:

a flexible circuit of substantially planar elongated shape including a dielectric having at least one edge and a plurality of metal conductive lines;

a sheath of webbed netting wrapped substantially entirely around said flexible circuit for providing reinforcement of said flexible circuit;

an overcoat of material totally surrounding and encasing said sheath of webbed netting and said flexible circuit; and at least one round strand of reinforcement fibers positioned along said edge of said dielectric of said flexible circuit and encased within said sheath of webbed netting, said strand of reinforcement fibers preventing tearing of said flexible circuit and protecting said metal conductive lines from metal fatigue, said strand not being securedly attached to said dielectric of said flexible circuit and adapted for moving independently of said dielectric during twisting, pulling or other similar motion of said flexible cable.

2. The flexible cable of claim 1 wherein said dielectric of said flexible circuit is comprised of a polyimide film or polyethylene film base.

3. The flexible cable of claim 1 wherein said strand of reinforcement fibers is aramide.

4. The flexible cable of claim 1 wherein said conductive lines are spacedly located along an upper surface of said dielectric.

5. The flexible cable of claim 1 wherein said conductive lines are located internally of said dielectric and surrounded by said dielectric.

6. The flexible cable of claim 1 further comprising a storage case for storing said cable within said case, and a retention and retraction device for said cable, said device disposed within said case.

7. The flexible cable of claim 6 wherein said retention and retraction device comprises a spool for reeling said flexible cable, a retainer rod means for attaching said flexible cable to said spool for positioning said flexible cable such that said flexible cable is coiled around said spool when said spool is rotated in a first direction and said flexible cable is released from said coiled position when said spool is rotated in a second direction, a coil spring disposed between an inner wall of said case and said spool for biasing said spool, a ratchet wheel disposed within said ease, said ratchet wheel concentric with said spool, a release button positioned in said first opening of said ease, and an actuation lever integral with said button and disposed such that the lever extends toward said ratchet wheel, said lever having a length such that depression of said button causes said lever to release said ratchet wheel such that said coil spring forces said spool to rotate and retract said cable.

8. A portable external flexible cable system comprising:

(a) a flexible circuitry cable having a first end and a second end, said cable further including, an essentially planar elongated segment of flexible circuit material including a dielectric having at least one edge and a plurality of metal conductive lines;

a sheath of webbed netting wrapped substantially entirely around said flexible circuit material for providing reinforcement of said flexible circuit material;

an overcoat of material totally surrounding and encasing said sheath of webbed netting and said flexible circuit material;

at least one round strand of reinforcement fibers positioned along said edge of said flexible circuit material and encased within said sheath of webbed netting, said strand of reinforcement fibers preventing tearing of said flexible circuit and protecting said metal conductive lines from metal fatigue, said strand not being securely attached to said dielectric of said flexible circuit and adapted for moving independently of said dielectric during twisting, pulling or other similar motion of said flexible cable;

(b) a storage case having at least one opening on an exterior face;

(c) a retention and retraction device for said flexible circuitry cable disposed within said case, said retention and retraction device further including, a spool for reeling said flexible cable;

a retainer rod disposed in rotational communication with said spool for positioning said flexible circuitry cable such that said flexible circuitry cable is coiled around said spool when said spool is rotated in a first direction and said flexible circuitry cable is released from said coiled position when said spool is rotated in a second direction;

a coil spring disposed between an inner wall of said case and said spool for biasing said spool;

a ratchet wheel disposed within said case, said ratchet wheel concentric with said spool;

a release button positioned in said first opening of said case;

an actuation lever integral with said button and disposed such that the lever extends toward said ratchet wheel, said lever having a length such that depression of said button causes said lever to release said ratchet wheel such that said coil spring forces said spool to rotate and retract said cable;

(d) said flexible circuitry cable extending through said second opening of said storage case and terminating at said first end and said second end of said cable;

(e) a first connector attached to said flexible circuitry cable at said first end; and (f) a second connector attached to said flexible circuitry cable at said second end.

9. A method of making a flexible cable, said method comprising:

providing a flexible circuit of substantially planar elongated shape and including a dielectric having at least one edge and a plurality of metal conductive lines;

positioning at least one round strand of reinforcement fibers along said 6 edge of said dielectric of said flexible circuit for preventing tearing of said flexible circuit and for protecting said metal conductive lines from metal fatigue, said round strand not being securely attached to said dielectric of said flexible circuit and adapted for moving independently of said dielectric during twisting, pulling or other similar motion of said flexible cable;

wrapping a sheath of webbed netting substantially entirely around said flexible circuit and said round strand of reinforcement fibers to provide reinforcement of said flexible circuit; and totally surrounding and encasing said sheath of webbed netting with a layer of overcoat material.

10. The method as in claim 9 wherein said layer of overcoating material is applied by dipping said sheath of webbed netting, said round strand of reinforcement fibers and said flexible circuit in said overcoat material.

11. The method as in claim 9 wherein said webbed netting is wrapped about said flexible circuit in an overlapping manner using a heat staking operation.

* * * * *